United States Patent [19]
Sun et al.

[11] Patent Number: 5,915,165
[45] Date of Patent: Jun. 22, 1999

[54] METHOD OF MANUFACTURING VERTICAL CAVITY SURFACE EMITTING SEMICONDUCTOR LASERS USING INTERMIXING AND OXIDATION

[75] Inventors: Decai Sun; Philip D. Floyd, both of Sunnyvale, Calif.

[73] Assignee: Xerox Corporation, Stamford, Conn.

[21] Appl. No.: 08/990,500

[22] Filed: Dec. 15, 1997

[51] Int. Cl.[6] .................................................. H01S 3/18
[52] U.S. Cl. .......................... 438/47; 438/46; 438/960; 372/45; 372/46
[58] Field of Search .................................. 438/22, 36, 42, 438/46, 47, 960; 372/45, 50, 44, 46; 257/13

[56] References Cited

U.S. PATENT DOCUMENTS

| | | | |
|---|---|---|---|
| 5,071,786 | 12/1991 | Paoli ....................................... | 437/129 |
| 5,262,360 | 11/1993 | Holonyak, Jr. et al. ............... | 437/237 |
| 5,327,488 | 7/1994 | Garland .................................. | 379/201 |
| 5,353,295 | 10/1994 | Holonyak, Jr. et al. . | |
| 5,376,583 | 12/1994 | Northrup et al. ...................... | 437/133 |
| 5,386,428 | 1/1995 | Thornton et al. ....................... | 372/50 |
| 5,455,429 | 10/1995 | Paoli et al. . | |
| 5,719,891 | 2/1998 | Jewell ..................................... | 372/45 |
| 5,724,374 | 3/1998 | Jewell . | |
| 5,729,566 | 3/1998 | Jewell . | |

OTHER PUBLICATIONS

Beernink et al., "Differential Al–Ga interdiffusion in AlGaAs/GaAs and AlGaIn/GaInP heterostructures," Appl. Phys. Lett. 66 (26), Jun. 26, 1995, pp. 3597–3599.

Beernink et al., "Si diffusion and intermixing in AlGaAs/GaAs structures using buried impurity sources," Appl. Phys. Lett. 66 (19), May 8, 1995, pp. 2522–2524.

Caracci et al., "High–performance planar native–oxide buried–mesa index–guided AlGaAs–GaAs quantum well heterostructure lasers," Appl. Phys. Lett. 61 (3), Jul. 20, 1992, pp. 321–323.

Cheng et al., "Lasing Characteristics of High–Performance Narrow–Stripe InGaAs–GaAs Quantum–Well Lasers Confined by AlAs Native Oxide," IEEE Photonics Technology Letters, vol. 8, No. 2, Feb. 1996, pp. 176–178.

Choquette et al., "Threshold investigation of oxide–confined vertical–cavity laser diodes," App. Phys. Lett. 68 (26), Jun. 24, 1996, pp. 3689–3691.

Deppe et al., "Atom diffusion and impurity–induced layer disordering in quantum well III–V semiconductor heterostructures," J. Appl. Phys. 64 (12) Dec. 15, 1988, pp. R93–R113.

Floyd et al., "Comparison of Optical Losses in Dielectric–Apertured Vertical–Cavity Lasers," IEEE Photonics Technology Letters, vol. 8, No. 5, May 1996, pp. 590–592.

Fujii et al., "High–Power Operation of a Transverse–Mode Stabilised AlGaInP Visible Light ($\lambda_L$=683 nm) Semicoductor Laser," Electronics Letters, Aug. 27, 1987, vol. 23, No. 18, pp. 938–939.

Kish et al., "Properties and Use of $In_{0.5}(Al_xGa_{1-x})As$ Native Oxides in Heterostructure Lasers," Journal of Electronic Materials, vol. 21, No. 12, 1992, pp. 1133–1139.

Li et al., "Polarisation and modal behaviour of low threshold oxide and airgap confined vertical cavity lasers," Electronics Letters Nov. 9, 1995, vol. 31, No. 23, pp. 2014–2015.

Meehan et al., "Disorder of and $Al_xGa_{1-x}As$–GaAs superlattice by donor diffusion," Appl. Phys. Lett. 45 (5), Sep. 1, 1984, pp. 549–551.

Sun et al., "Control of Wet–Oxidation of AlAs/GaAs Superlattices by Impurity–Induced Layer Disordering," 1997 Electronics Materials Conference, Jun. 25–17, 1997.

*Primary Examiner*—Charles Bowers
*Assistant Examiner*—Keith Christianson

[57] ABSTRACT

The present invention relates to a vertical cavity surface emitting laser with an accurately defined and controlled aperture which directs the current path within the laser. Specifically, the oxide regions surrounding the aperture are formed by a pre-oxidation layer disordering process which controls the regions within which oxidation can occur. The present invention allows for the manufacture of highly compact lasers with reproducible optical and electrical characteristics.

6 Claims, 10 Drawing Sheets

METHOD OF MANUFACTURING VERTICAL CAVITY SURFACE EMITTING SEMICONDUCTOR LASERS USING INTERMIXING AND OXIDATION

CROSS REFERENCES TO RELATED APPLICATIONS

The present invention is related to the following commonly assigned and co-pending U.S. applications: (i) "Method of Controlling Oxidation in Semiconductor Materials," U.S. Ser. No. 08/756,663, filed on Nov. 26, 1996, invented by D. Sun and P. Floyd; and (ii) "Edge Emitting Semiconductor Lasers," U.S. Ser. No. 08/864,803, filed on May 29, 1997, invented by D. Sun and P. Floyd.

FIELD OF INVENTION

This invention relates to vertical cavity surface emitting laser structures formed by a selective oxidation process.

BACKGROUND OF THE INVENTION

Solid state semiconductor lasers are important devices in optoelectronic communication systems and high-speed printing systems. Although edge emitting lasers are currently used in the vast majority of such applications, recently, there has been an increased interest in vertical cavity surface emitting lasers ("VCSELs") therefor. One reason for the interest in VCSELs is that edge emitting lasers produce a beam with a large angular divergence, making efficient collection of the emitted beam more difficult. Furthermore, edge emitting lasers cannot be tested until the wafer is cleaved into individual devices, the edges of which form the mirror facets of each device. On the other hand, the beam of a VCSEL has a small and circular angular divergence, and the VCSEL is a stacked structure that incorporates the mirrors monolithically into its layer design. Therefore, it allows for on-wafer testing and for monolithic fabrication of one-dimensional or two-dimensional laser arrays.

A known technique to fabricate a VCSEL's laser emitting aperture is by a lateral oxidation process. In this process, the stack of epitaxial layers comprising the laser device includes an AlGaAs layer with a high aluminum content disposed either above or below the active layer. Then, a patterned etching is performed, forming a mesa structure and exposing the edges of the stacked layers. To form the lasing aperture or the emissive region, the structure is exposed to an oxidizing environment which will cause only the high aluminum content AlGaAs layer to be oxidized laterally inwardly from its free edges towards the center of the mesa structure. Other layers in the structure remain essentially unoxidized since their aluminum content is lower. Thus, the oxidized portions of the high aluminum content layer become electrically non-conductive and the remaining unoxidized portions, which remain conductive, form the laser aperture, which directs the current path through the VCSEL structure. A VCSEL formed by such a technique is discussed in "Selectively Oxidized Vertical Cavity Surface Emitting Lasers With 50% Power Conversion Efficiency," Electronics Letters, vol. 31, pp.208–209 (1995).

One disadvantage of this approach is that the oxidation process results in poor control over the shape of the aperture. The process produces apertures with uneven and jagged boundaries because the rate of oxidation through different portions of the high aluminum content AlGaAs layer depends upon the direction of the oxidation fronts relative to the crystal orientation.

Another disadvantage of this approach is the difficulty in controlling the amount of oxidation in order to accurately define the aperture. A typical mesa for a VCSEL structure is on the order of 50 to 100 microns ($\mu$m) across and the desired device aperture is generally on the order of one to tens of microns. Therefore, several tens of microns of lateral oxidation would typically be required in order to fabricate the device. Since the size of the resulting aperture is small relative to the extent of the lateral oxidation regions, the devices formed will have severe variations in their performance characteristics, aperture sizes, and aperture shapes. This lateral oxidation approach is also sensitive to composition non-uniformity and fluctuation in processing temperatures. These shortcomings decrease the reproducibility of device performance and result in, manufacturability and yield problems.

Accordingly, there is a need for developing VCSEL structures with well-defined and well-controlled apertures. These structures should also allow for the formation of high density and high uniformity laser arrays.

BRIEF SUMMARY OF INVENTION

The present invention provides an approach to building a vertical cavity surface emitting laser comprising a plurality of active region layers including an active layer and an adjacent group of disordering layers having a well defined intermixed conductive portion bounded by an outlying nonconductive, oxidized portion, wherein the aperture which controls the current flowing through the active layer is defined by the intermixed portion.

The advantages of the present invention will become apparent to those skilled in the art from the following detailed description of the invention, its preferred embodiments, the accompanying drawings, and the appended claims.

DETAILED DESCRIPTION OF PREFERRED EMBODIMENTS

Figure 1:
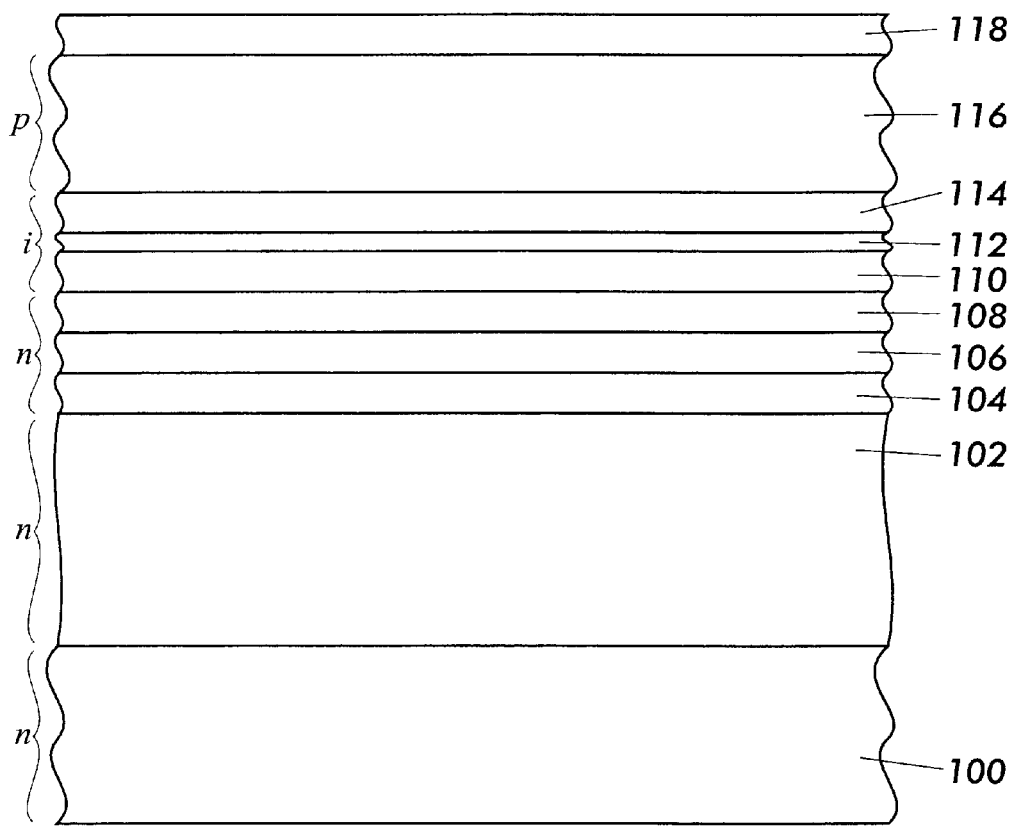
FIG. 1 illustrates a cross-sectional view of a stacked semiconductor structure that is used to form a VCSEL in accordance with one form of the present invention.

Turning now to the drawings, there is illustrated in FIG. 1 a stacked semiconductor structure which is used to form a VCSEL in accordance with the present invention. The stacked structure includes a number of semiconductor layers formed by an epitaxial process such as metal-organic chemical vapor deposition ("MOCVD"), liquid phase epitaxy ("LPE"), molecular beam epitaxy ("MBE"), or other known crystal growth processes. As shown in FIG. 1, the stacked semiconductor structure is generally in the form of a P-I-N diode as represented by the notation overlying the structure. It includes a highly doped n-type GaAs substrate 100, whose doping is typically on the order of $5 \times 10^{18}$ cm$^{-3}$, on which is deposited an n-type superlattice structure, collectively identified as the monolithic region 102, forming a lower distributed Bragg reflector ("DBR"). This lower DBR provides the necessary internal reflection, as required in a VCSEL structure. If desired, a buffer layer (not shown) of about 0.5 $\mu$m may be inserted between the substrate 100 and the superlattice structure 102.

The superlattice structure 102 typically comprises multiple pairs of $Al_xGa_{1-x}As$ and $Al_yGa_{1-y}As$ layers (not shown). The $Al_yGa_{1-y}As$ layers in the superlattice typically have a low aluminum content, on the order of 10%, so as to achieve a desired refractive index, but should have sufficient aluminum so as to be non-absorptive at the lasing wavelength. The $Al_xGa_{1-x}As$ layers have an aluminum content of about 95% to differentiate them from the AlAs layer in the disordering layers (as will be described). After the growth of a number of layer pairs, typically about 20 to 40, a final $Al_{0.95}Ga_{0.05}As$ layer is deposited before growing further layers. The total thickness of each layer pair is designed to be equal to one half of the optical wavelength and the thickness of the final $Al_{0.95}Ga_{0.05}As$ layer is designed to be a quarter of the optical wavelength, at the desired wavelength of laser operation, which is typically in the range of 670 to 980 nanometers.

In this embodiment, since light is designed to be outcoupled through the top surface of the VCSEL structure, the reflectivity of the lower DBR 102 should be as close to 100% as possible, in order to achieve high internal reflection. It is well known that the reflectivity of the lower DBR 102 is generally a function of the difference in the refractive indices between its $Al_xGa_{1-x}As$ and $Al_yGa_{1-y}As$ layers, and is also a function of the number of layer pairs in the structure. Thus, the greater the difference in the refractive indices, the fewer number of pairs are required.

Deposited over the lower DBR structure 102 is a group of three n-type disordering layers which are provided to be preferentially and locally intermixed by the impurity induced layer disordering ("IILD") process. This group comprises first an AlGaAs layer 104 of approximately 20 nanometers, second, an AlAs layer 106 of about 15 nanometers, and lastly, another AlGaAs layer 108 of about 20 nanometers. Layers 104 and 108 have an aluminum content of approximately 40%, whereas layer 106 has an aluminum content of approximately 100%. These layers are silicon doped, wherein the silicon doping of the AlGaAs layers, 104 and 108, is on the order of $1$–$5 \times 10^{18}$ cm$^{-3}$ while the silicon doping of the AlAs layer 106 is on the order of $5 \times 10^{18}$ cm$^{-3}$. The silicon acts as the disordering agent which enables intermixing by the IILD process. The n-type disordering layers may also be associated with the lower, n-type, DBR structure by being incorporated therein.

Above these disordering layers is deposited a group of three intrinsic, undoped, active region layers in which the desired optical gain can be attained. The active region layers include a first AlGaAs cladding layer 110 having an aluminum content of about 40% and a thickness of approximately 65 nanometers, a GaAs active layer 112 which comprises one to two quantum wells, each with a thickness of five to ten nanometers, and a second AlGaAs cladding layer 114 having an aluminum content of about 40% and a thickness of approximately 100 nanometers. Although the quantum wells are preferably formed of GaAs, $In_xGa_{1-x}As$ or $Al_xGa_{1-x}As$ may also be used, depending upon the desired output wavelength. Of course, other multiple quantum well structures ("MQW") also may be used to form the active layer 112.

The total thickness of layers 104, 106, 108, 110, 112 and 114, collectively identified as the optical cavity layers, is typically equal to the intended wavelength of laser operation divided by the average refractive index of these layers.

Above the upper AlGaAs cladding layer 114 is deposited a p-type superlattice structure, collectively identified as the monolithic region 116, which forms an upper DBR mirror 116. The upper DBR mirror 116 is structurally similar to the lower DBR mirror 102 except for the polarity of its dopants. Additionally, the mirror layer closest to the active region generally has a high aluminum content. In this embodiment, the reflectivity of the upper DBR 116 is typically 98% to 99% because light will be outcoupled through the upper surface of the VCSEL. Typically, 15 to 25 pairs of alternating $Al_{0.95}Ga_{0.05}As$ and $Al_{0.10}Ga_{0.90}As$ layers are used to form this upper DBR mirror 116. Finally, a p$^+$-GaAs layer 118 is deposited for the formation of p-type contacts.

Figure 2:
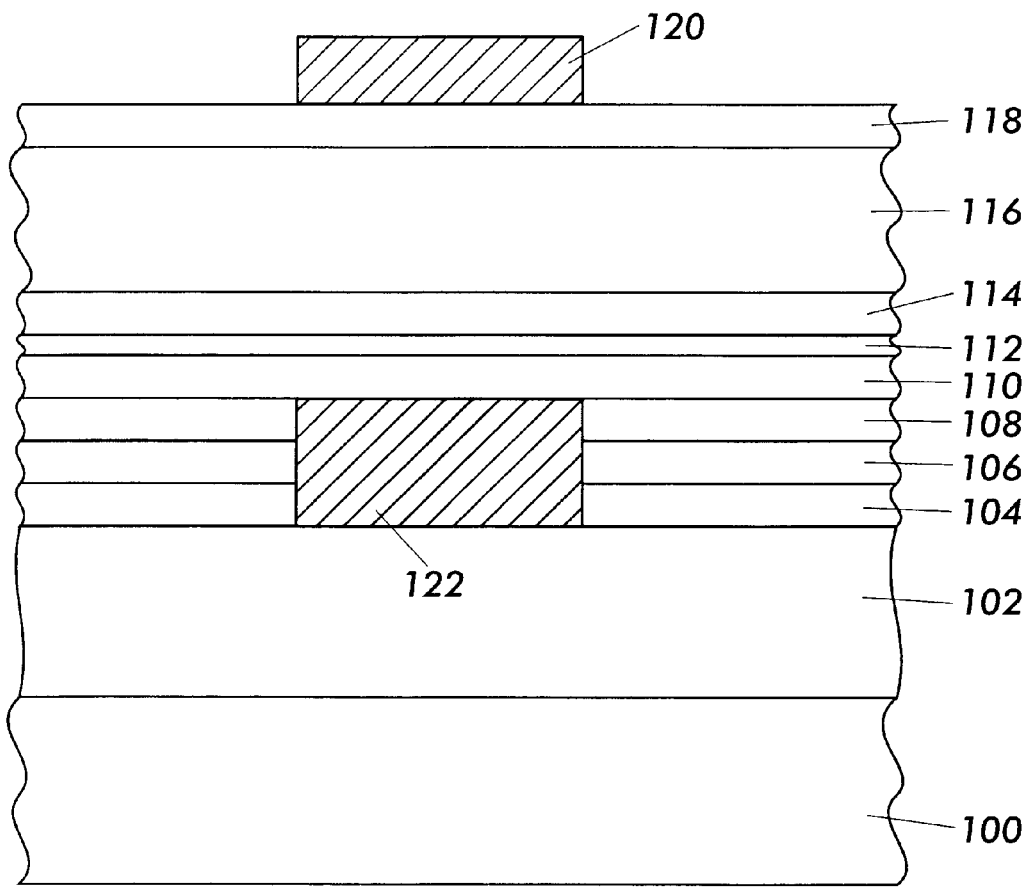
FIG. 2 illustrates the stacked semiconductor structure shown in FIG. 1 after deposition of a silicon nitride cap and completion of an IILD process.
Figure 3:
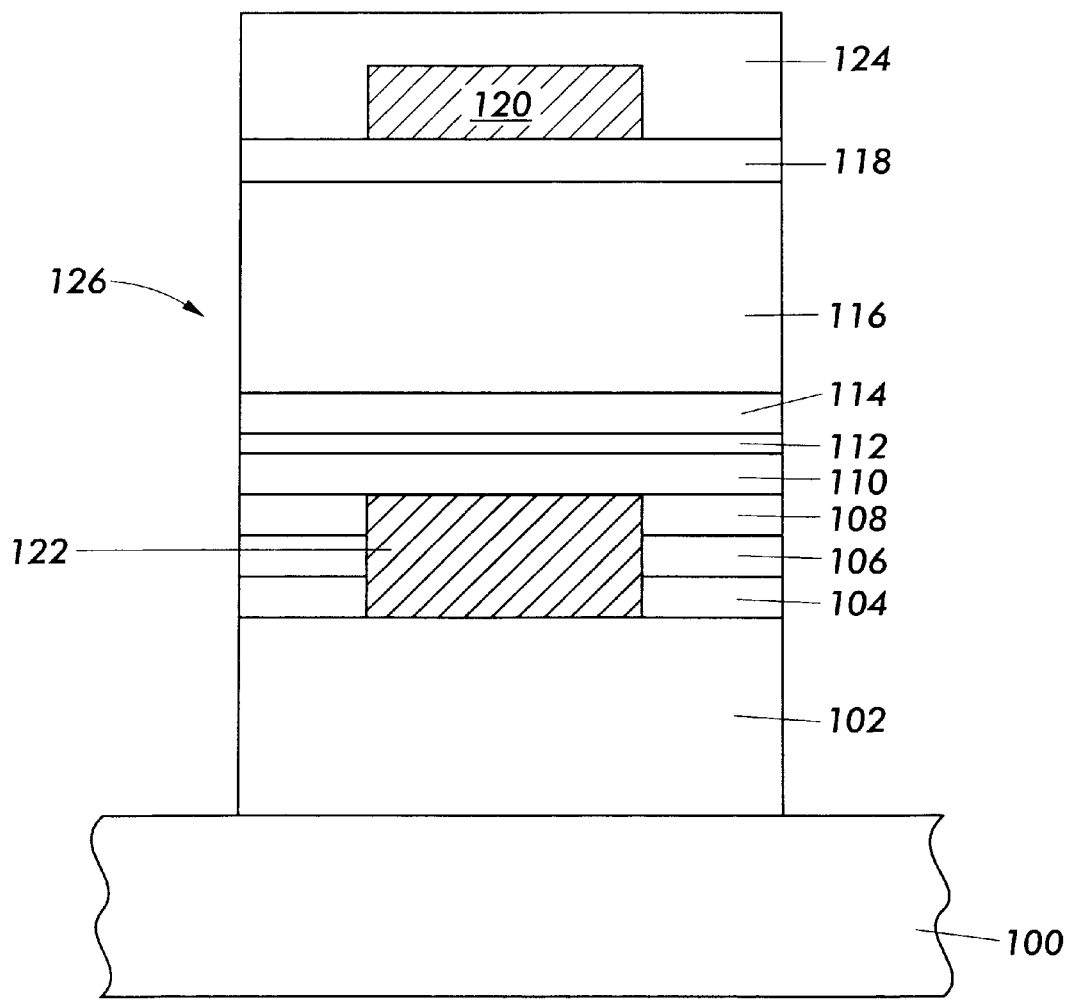
FIG. 3 illustrates the stacked semiconductor structure shown in FIG. 2 after deposition of a silicon dioxide cap and completion of a mesa etching process.

After all the semiconductor layers shown in FIG. 1 have been deposited, a silicon nitride layer is deposited on the surface of the semiconductor structure and is photolithographically formed into the capping mask 120, as shown in FIG. 2. The capping mask 120 overlies the location where the aperture is to be formed and defines its configuration, as will be described below. The n-type disordering agent, created by the silicon dopants in the disordering layers 104, 106 and 108 generates Group III vacancies in these layers. During the IILD process, the semiconductor structure is placed in a furnace and elevated into the range of about 800 to 900° C. for several (about ten) hours to allow intermixing of the Group III elements, gallium and aluminum, to occur under the silicon nitride cap 120. In the regions outside of the nitride cap 120 arsenic outdiffuses causing Group V vacancies to increase. But since the number of Group III vacancies ($V_V$) times the number of Group III vacancies ($V_{III}$) must remain constant ($V_V \times V_{III} = k$), as the Group V vacancies increase due to arsenic outdiffusion, the number of Group III vacancies decrease thus reducing the capability of these regions to intermix. Intermixing will be confined to the region 122 under the cap 120.

During the intermixing process in the region 122, the aluminum composition decreases and the gallium composition increases in the layer 106, which originally had a high aluminum content, while conversely the aluminum composition increases and the gallium composition decreases in the layers 104 and 108 which originally had a low aluminum content. Thus, after a typical IILD process, the region 122 has an average aluminum content of less than about 95%. Minimal intermixing of Group III elements occurs in the regions outside of the silicon nitride cap 120.

After the layer disordering process has been completed, a silicon dioxide layer 124 is deposited on the surface of the semiconductor structure. Layer 124 is masked and an etching process is performed to form mesa 126, as shown in FIG.

3. This exposes the edges of the AlAs layer 106 for the next step, oxidation.

Figure 4:
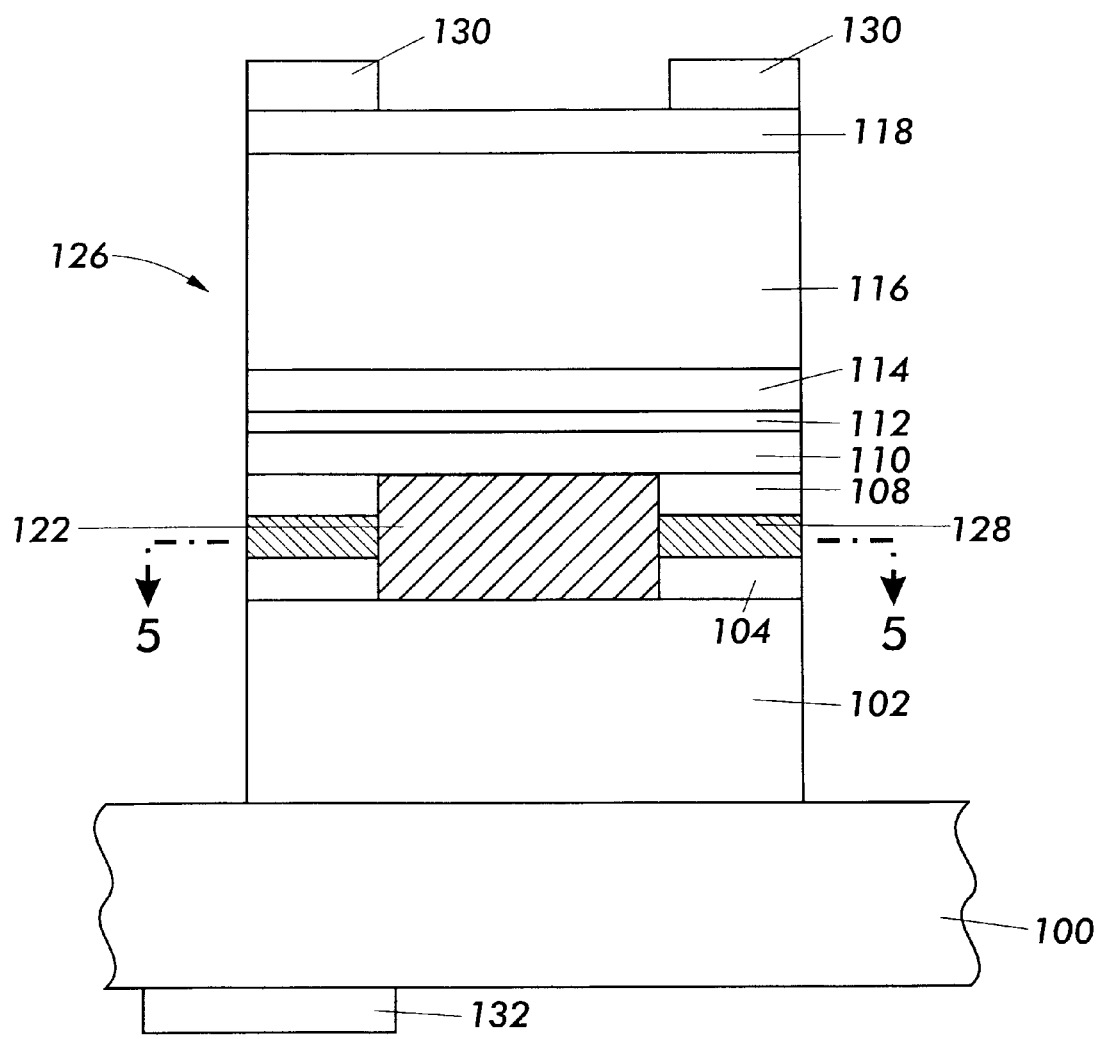
FIG. 4 illustrates a VCSEL structure formed in accordance with the present invention.

The oxidation environment is water vapor at a temperature of 400 to 500° C. Since there exists a difference between the aluminum mole fractions in intermixed region 122 and the outboard non-intermixed regions of the AlAs layer 106, there will be a disparity in the oxidation rates of these two regions because the oxidation rate of AlGaAs varies exponentially with the aluminum mole fraction. For example, the oxidation rate of AlAs is about 1.5 $\mu$m per minute at 450° C. while it is about 0.05 $\mu$m per minute for AlGaAs with about 95 percent aluminum and about 0.01 $\mu$m per minute for AlGaAs with about 80 percent aluminum. Due to this significant difference in the oxidation rates, oxidation slows down substantially when it reaches the interface between the intermixed and non-intermixed regions. The oxidized regions are identified in FIG. 4 at 128.

After the oxidation process has been completed, the silicon nitride cap 120 and the silicon dioxide masking layer 124 are removed. Finally, upper p-type contacts 130 of titanium/gold, and a lower n-type contact 132 of germanium/gold are formed on the semiconductor structure.

Figure 5:
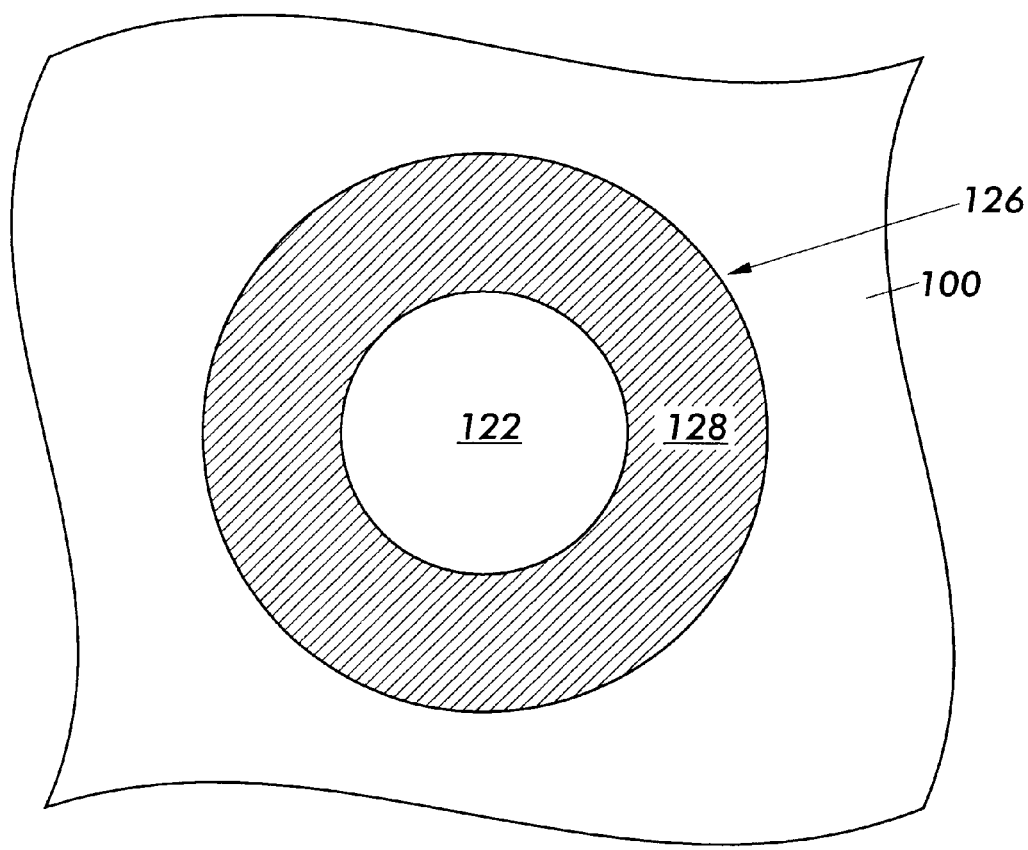
FIG. 5 illustrates a view taken substantially in the direction of line 5—5 of FIG. 4, showing a non-oxidized aperture region and a surrounding oxidation region.
Figure 6:
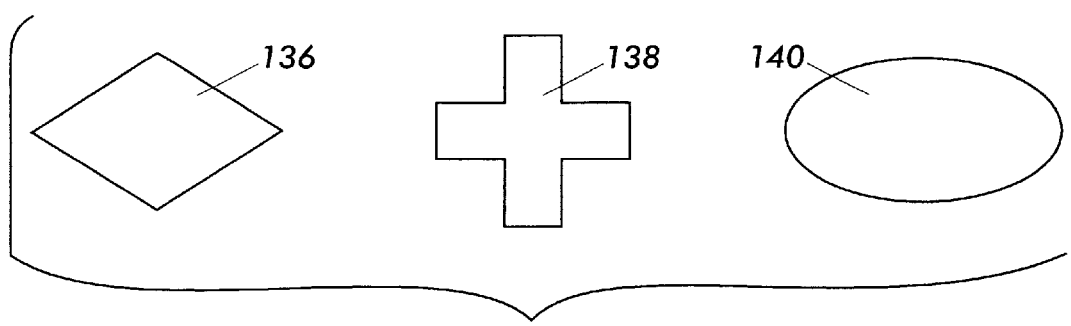
FIG. 6 illustrates schematic representations of three anisotropic apertures.

As can be seen in FIG. 5 the aperture 134 defined by the intermixed region 122 is smoothly circular in shape. It has been found that such a structure offers both electrical and optical confinement in a VCSEL because the surrounding oxide 128 is electrically insulating and has an adequately low refractive index of approximately 1.6. The formation of the oxide region 128 is controlled photolithographically, thus affording a high degree of accuracy and flexibility in the size and shape of the optical aperture. As shown in FIG. 6, anisotropic apertures 136, 138 and 140 of virtually any other shape can be formed. Utilizing the present invention, not only does the aperture of a VCSEL tend to be smooth, it can be formed in any arbitrary shape or size. In contrast, a typical oxidation process without a layer disordering step generally produces jagged and uneven boundaries because the oxidation rates of alloys depend upon their crystal orientation.

Figure 7:
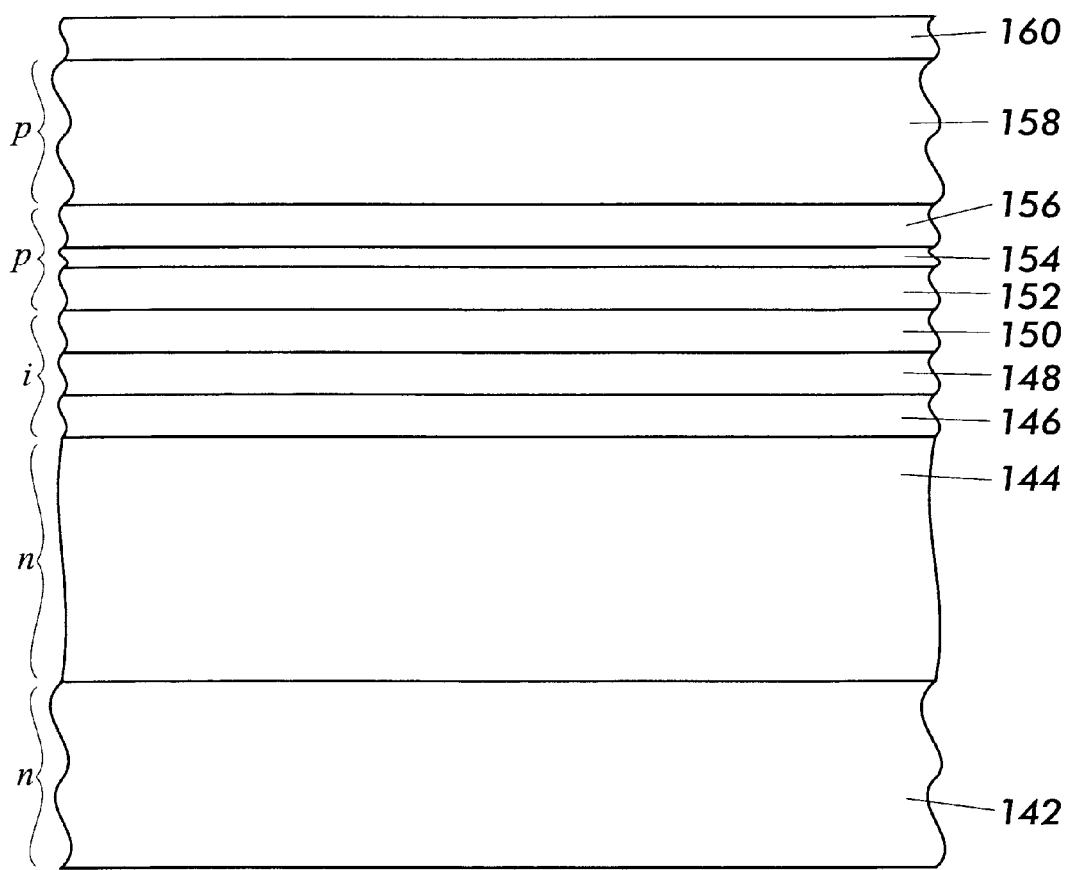
FIG. 7 illustrates a cross-sectional view of a stacked semiconductor structure that is used to form a VCSEL in accordance with an alternative form of the present invention.

In FIGS. 7 to 10 there is illustrated an alternative embodiment which uses three p-type disordering layers in lieu of the n-type disordering layers of the previous embodiment. A typical p-type dopant is magnesium. As can be seen in FIG. 7, the stacked semiconductor structure is in the form of a P-I-N diode as represented by the notation overlying the structure. The structure is very similar to that shown in and described relative to FIG. 1, with the exception that the p-type doping of the disordering layers requires a reversal in the positioning of the disordering layers and the active region layers. The stacked structure comprises a highly doped n-type GaAs substrate 142, an n-type superlattice structure, collectively identified as the monolithic region 144, forming a lower distributed Bragg reflector ("DBR"), a group of three intrinsic, undoped, active region layers 146, 148 and 150, a group of three p-type disordering layers 152, 154 and 156, a p-type superlattice structure, collectively identified as the monolithic region 158, which forms an upper DBR mirror 158, and a p$^+$-GaAs layer 160 deposited for the formation of p-type contacts thereon. As in the above described embodiment, the disordering layers are associated with the DBR mirror of the same dopant type.

The active region layers include a first AlGaAs cladding layer 146 having an aluminum content of about 40% and a thickness of approximately 110 nanometers, a GaAs active layer 148 which comprises one to two quantum wells, each with a thickness of five to ten nanometers, and a second AlGaAs cladding layer 150 having an aluminum content of about 40% and a thickness of approximately 65 nanometers. Although the quantum wells are preferably formed of GaAs, $In_xGa_{1-x}As$ or $Al_xGa_{1-x}As$ may also be used, depending upon the desired output wavelength. Of course, other multiple quantum well structures ("MQW") also may be used to form the active layer 148.

The p-type disordering layers include an AlGaAs layer 152 of approximately 20 nanometers, an AlAs layer 154 of about 15 nanometers, and another AlGaAs layer 156 of about 20 nanometers. The magnesium doping of these layers is on the order of $5\times10^{18}$ cm$^{-3}$. Layers 152 and 156 have an aluminum content of approximately 40%, whereas layer 106 has an aluminum content of approximately 100%.

Figure 8:
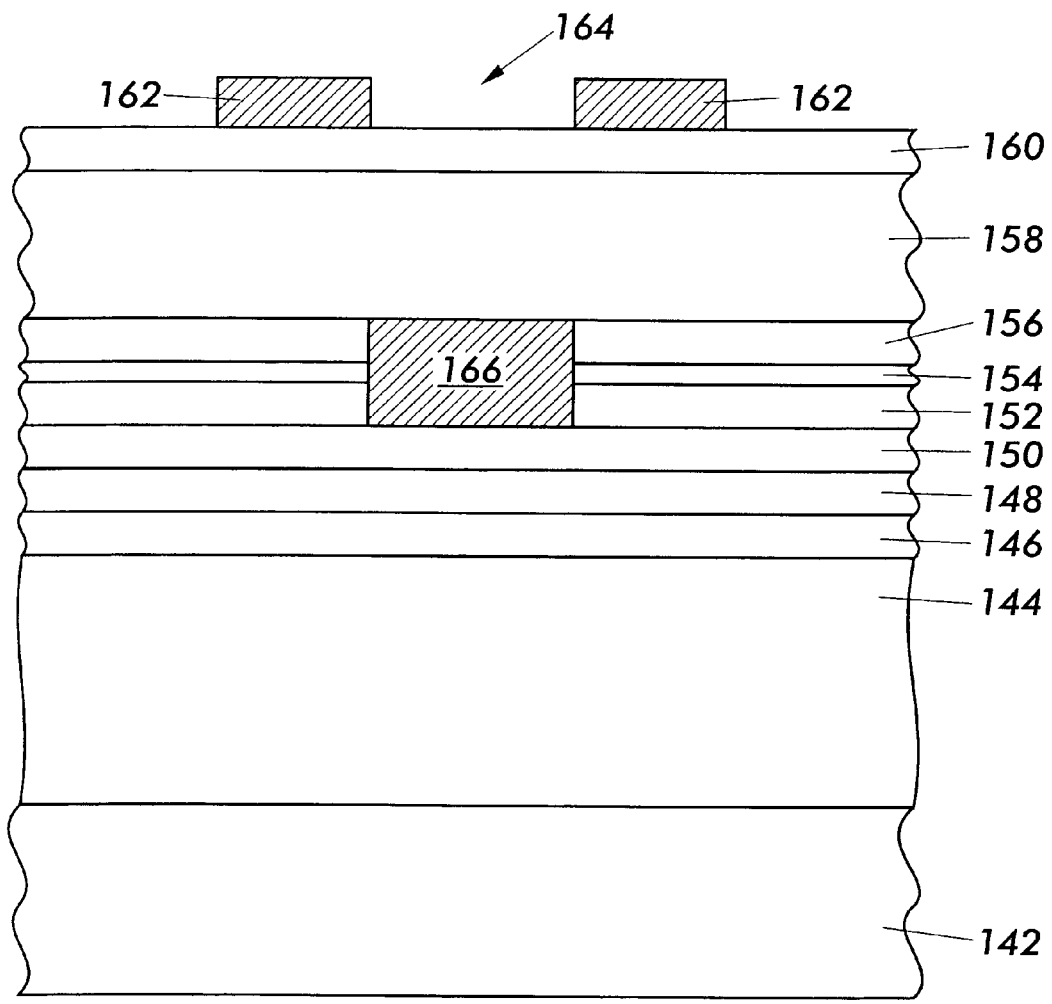
FIG. 8 illustrates the stacked semiconductor structure shown in FIG. 7 after deposition of silicon nitride caps and completion of an IILD process.

After all the semiconductor layers shown in FIG. 7 have been deposited, a silicon nitride layer is deposited on the surface of the semiconductor structure and is photolithographically formed into the capping mask structure 162, as shown in FIG. 8. The portion of the capping mask 162 overlying the location where the aperture is to be formed is removed, thus defining the aperture configuration in this opening 164. The p-type disordering agent, created by the magnesium dopants in the disordering layers 152, 154 and 156 generates Group III interstitials in these layers. During the IILD process, the semiconductor structure is annealed in a furnace at about 800 to 900° C. for several (about ten) hours to allow intermixing of the Group III elements, gallium and aluminum, to occur in the region 166 below the opening 164. Arsenic outdiffuses in this space, causing Group V vacancies to increase. But since the number of Group III vacancies ($V_V$) times the number of Group III vacancies ($V_{III}$) must remain constant ($V_V \times V_{III}$=k), as the Group V vacancies increase due to arsenic outdiffusion, the number of Group III vacancies decrease. Since there is also a constant relationship between Group III interstitials ($I_{III}$) and Group III vacancies ($V_{III}$), i.e. $I_{III} \times V_{III}$=k, as the Group III vacancies decrease the Group III interstitials increase, enhancing intermixing in layers 152, 154 and 156 under the opening 164 in the cap 162.

During the intermixing process in region, the aluminum composition decreases and the gallium composition increases in the layer 154, which originally had a high aluminum content, while conversely the aluminum composition increases and the gallium composition decreases in the layers 152 and 156 which originally had a low aluminum content. Thus, after a typical IILD process, the intermixed region 166 has an average aluminum content of less than about 95%. In contrast to the first embodiment incorporating n-type disordering layers, minimal intermixing of Group III elements occurs in the regions directly under the silicon nitride cap 162 with the p-type disordering layers of this embodiment.

Figure 9:
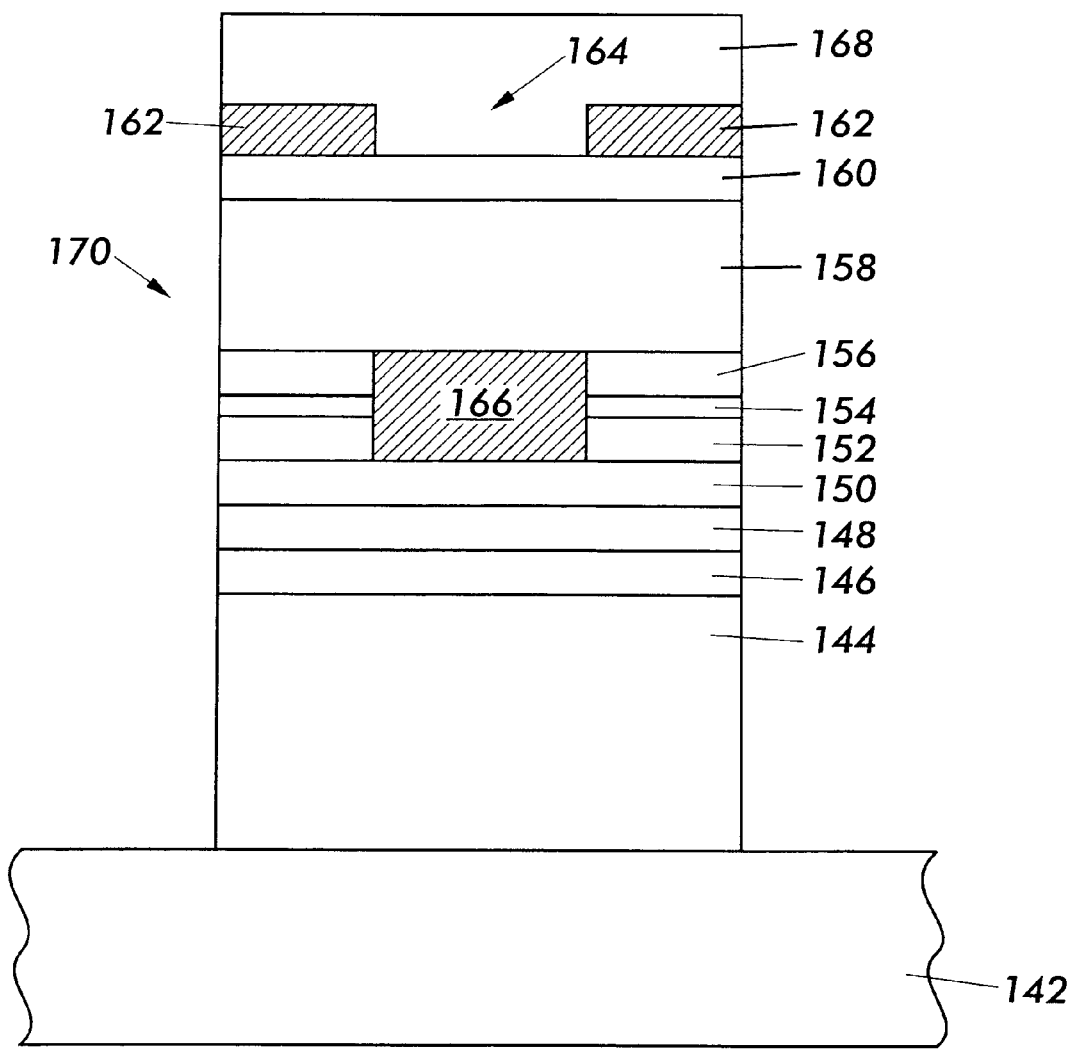
FIG. 9 illustrates the stacked semiconductor structure shown in FIG. 7 after deposition of a silicon dioxide cap and completion of a mesa etching process.

After the layer disordering process has been completed, a silicon dioxide layer 168 is deposited on the surface of the semiconductor structure. Layer 168 is masked and an etching process is performed to form mesa 170, as shown in FIG. 9. This exposes the edges of the AlAs layer 154 for the next step, oxidation.

The oxidation environment is water vapor at a temperature of 400° to 500° C. Since there exists a difference between the aluminum mole fractions in intermixed region 166 and in the outboard, non-intermixed, regions of the AlAs layer 154, there will be a disparity in the oxidation rates of these two regions because the oxidation rate of AlGaAs varies exponentially with the aluminum mole fraction. For example, the oxidation rate of AlAs with 100% aluminum is about 1.5 μm per minute at 450° C. while it is about 0.01 μm per minute for AlGaAs with about 80 percent aluminum. Due to this significant difference in the oxidation rates, oxidation slows down substantially when it reaches the interface between the intermixed and non-intermixed regions. The oxidized regions are identified in FIG. 10 at 172.

Figure 10:
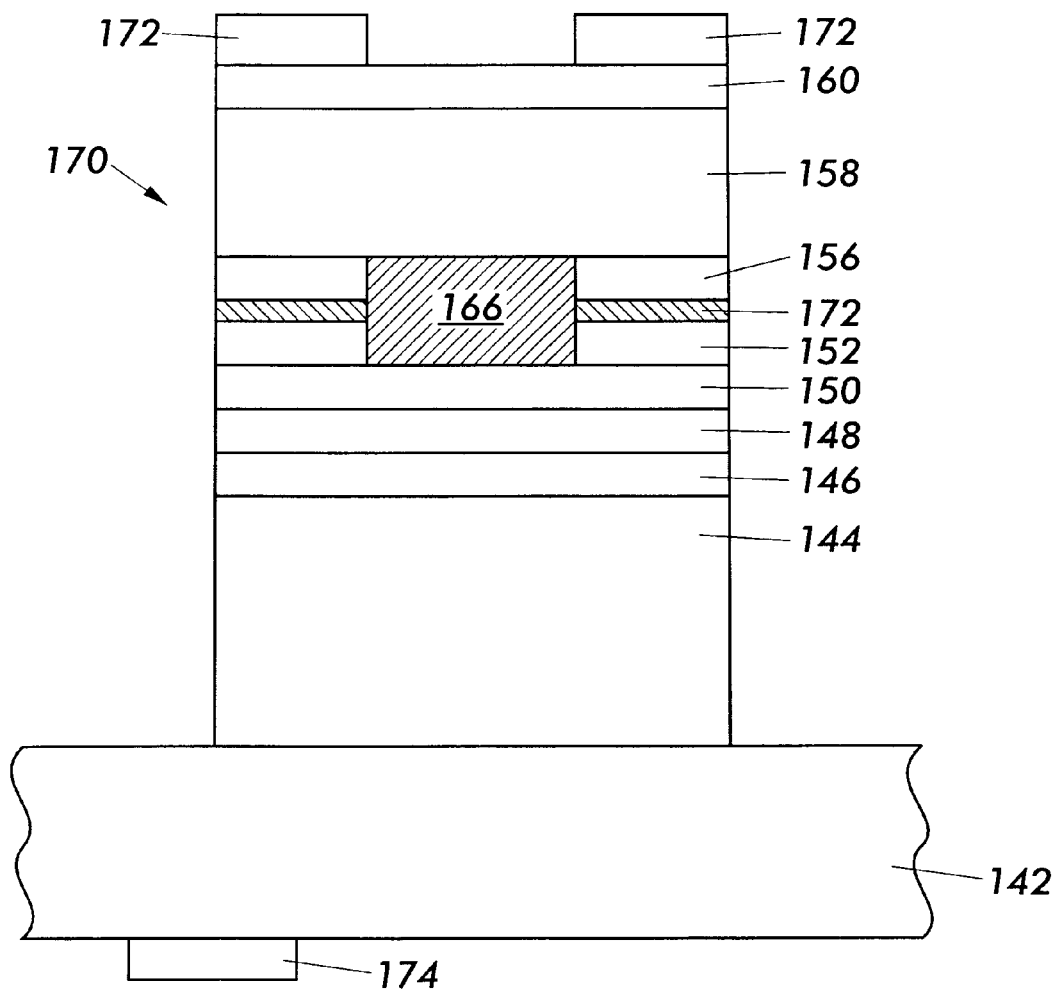
FIG. 10 illustrates a VSEL structure formed in accordance with the alternative form of the present invention.

After the oxidation process has been completed, the silicon nitride cap 162 and the silicon dioxide masking layer 168 are removed. Finally, upper p-type contacts 172 of titanium/gold, and a lower n-type contact 174 of germanium/gold are formed on the semiconductor structure, as shown in FIG. 10.

In both embodiments, the intermixed region in the disordering layers, which defines the aperture of the VCSEL, is accurately formed with relatively smooth and sharp boundaries controlled by the photolithographically formed capping layer mask.

Other sources which can cause layer disordering include other p- or n-type impurities as well as Group III or V vacancies. The composition, dopants, doping levels, and dimensions given above are exemplary only, and variations in these parameters are permissible. Additionally, other layers in addition to the ones shown in the figures may also be included. Variations in experimental conditions such as intermixing temperature, time, and oxidation temperature are also permitted. Lastly, instead of GaAs and GaAlAs, other semiconductor materials such as GaAlSb, InAlGaP, or other III–V alloys may also be used.

While the invention has been described in conjunction with specific embodiments, it is evident to those skilled in the art that many alternatives, modifications, and variations will be apparent in light of the foregoing description. Accordingly, the invention is intended to embrace all other such alternatives, modifications, and variations that fall within the spirit and scope of the appended claims.

What is claimed is:

1. A method for forming a surface emitting laser including the steps of
    providing a substrate;
    depositing a stack of semiconductor layers on said substrate, said semiconductor layers including;
    a lower mirror,
    a group of active region layers,
    a group of impurity doped disordering layers, and
    an upper mirror,
    forming a capping mask upon a portion of the surface of said stack of semiconductor layers;
    annealing said capped stack of semiconductor layers to cause intermixing of a first region of said disordering layers under the capping mask, while leaving a second region of said disordering layers to remain unintermixed;
    etching said stack of semiconductor layers to form a mesa and to expose the edges of said layers; and
    converting one of said disordering layers to become electrically insulating solely in said second region.

2. The method for forming a surface emitting laser as set forth in claim 1 wherein said lower mirror is n-doped, said upper mirror is p-doped, said group of active region layers is undoped, and said group of disordering layers is n-doped and is associated with said lower mirror, and
    said intermixing of said first region of said disordering layers occurs directly under said capping mask.

3. The method for forming a surface emitting laser as set forth in claim 1 wherein
    said lower mirror is n-doped, said upper mirror is p-doped, said group of active region layers is undoped, and said group of disordering layers is p-doped and is associated with said upper mirror,
    said capping mask includes an opening therein, and
    said intermixing of said first region of said disordering layers occurs directly under said opening.

4. The method for forming a surface emitting laser as set forth in claim 1 wherein
    when depositing said group of disordering layers there is provided a central layer having an aluminum content of about 100% and sandwiching layers having an aluminum content of about 40%, and
    said intermixing in said first region during said annealing step changes the aluminum content of said central layer and said sandwiching layers to an aluminum content lower than said central layer.

5. The method for forming a surface emitting laser as set forth in claim 4 wherein said converting step comprises oxidation.

6. The method for forming a surface emitting laser as set forth in claim wherein the rate of oxidation in said high aluminum content central layer is substantially higher than the rate of oxidation in said lower aluminum content sandwiching layers and said intermixed first region, so that oxidation occurs only in said central layer and stops at the interface between said intermixed and unintermixed regions.

\* \* \* \* \*

UNITED STATES PATENT AND TRADEMARK OFFICE
CERTIFICATE OF CORRECTION

PATENT NO. : 5,915,165
APPLICATION NO. : 08/990500
DATED : June 22, 1999
INVENTOR(S) : Decai Sun et al.

It is certified that error appears in the above-identified patent and that said Letters Patent is hereby corrected as shown below:

Column 1,
Line 15, insert -- This invention was made with Government support under Agreement No. 70NANB2H1241 awarded by the Department of Commerce. The Government has certain rights in this invention. --.

Signed and Sealed this

Eleventh Day of July, 2006

JON W. DUDAS
*Director of the United States Patent and Trademark Office*